United States Patent
Park

[19]

[11] Patent Number: 6,114,217
[45] Date of Patent: Sep. 5, 2000

[54] METHOD FOR FORMING ISOLATION TRENCHES ON A SEMICONDUCTOR SUBSTRATE

[75] Inventor: Young-Tack Park, Bucheon, Rep. of Korea

[73] Assignees: ANAM Semiconductor Inc., Rep. of Korea; Amkor Technology Inc., Chandler, Ariz.

[21] Appl. No.: 09/199,706

[22] Filed: Nov. 24, 1998

[30] Foreign Application Priority Data

Nov. 24, 1997 [KR] Rep. of Korea ............ 97-62319

[51] Int. Cl.[7] ................................. H01L 21/76
[52] U.S. Cl. ................ 438/424; 438/437; 148/DIG. 50
[58] Field of Search .................... 438/424, 427, 438/435, 437, 296; 148/DIG. 50

[56] References Cited

U.S. PATENT DOCUMENTS

| | | | |
|---|---|---|---|
| 5,498,565 | 3/1996 | Gocho et al. | 148/DIG. 50 |
| 5,679,599 | 10/1997 | Mehta | 148/DIG. 50 |
| 5,911,110 | 6/1999 | Yu | 438/427 |
| 5,930,644 | 7/1999 | Tsai et al. | 438/424 |
| 5,943,590 | 8/1999 | Wang et al. | 438/427 |
| 5,953,621 | 9/1999 | Gonzalez et al. | 438/424 |

*Primary Examiner*—Trung Dang
*Attorney, Agent, or Firm*—Skjerven, Morrill, MacPherson, Franklin, & Friel LLP; Don C. Lawrence

[57] ABSTRACT

Disclosed is a method for providing an insulation trench on a semiconductor substrate. The method includes the steps of depositing a pad oxide layer and a nitride layer on a semiconductor substrate; etching the nitride layer and the pad oxide layer and depositing a first insulating layer; forming spacers along sidewalls of the pad oxide layer and the nitride layer by anisotropic etching the first insulating layer; forming trenches by etching the semiconductor substrate; forming a trench insulating layer pattern by depositing a second insulating layer and etching the same; and polishing the trench insulating layer pattern.

16 Claims, 3 Drawing Sheets

METHOD FOR FORMING ISOLATION TRENCHES ON A SEMICONDUCTOR SUBSTRATE

BACKGROUND OF THE INVENTION

1. Field of the Invention

The present invention relates to the manufacture of semiconductor devices, and more particularly, to a method for forming isolation trenches on a semiconductor substrate.

2. Description of Related Art

There are two basic methods for separating active areas on a semiconductor substrate: the LOCOS (localized oxidation of silicon) method, and trench isolation. However, with the increasing complexity of semiconductor devices and shrinking dimensions of the same, trench isolation is emerging as the standard method of separating active areas on the semiconductor substrate.

In trench isolation, however, the insulation layer on the sidewalls of the trenches is removed by errors made in the etching process. This results in the exposure of the semiconductor substrate. When this happens, if voltage is applied to a gate electrode after the forming of a semiconductor device such as a transistor, the electric field formed on the semiconductor substrate becomes distorted, or the leakage of current occurs. This is the so-called "corners" effect.

In an attempt to overcome these drawbacks, U.S. Pat. No. 5,433,794, herein incorporated by reference in its entirety, discloses a method in which spacers are used to form isolation trenches with improved corners. Namely, a spacer is formed around the periphery of the trench, and the spacer is then combined with isolation material disposed in the trench to form a dome-like structure over the trench. The resulting structure extends over the peripheral edges of the trench, thereby overcoming the above described problems.

However, in such a conventional method, since the spacer is formed around the periphery of the trench area, the integration of the element is difficult and the possibility of the occurrence of mis-alignment increases.

SUMMARY OF THE INVENTION

The present invention has been made in an effort to solve the above problems.

It is an object of the present invention to provide a method for forming isolation trenches on a semiconductor substrate which prevents (a) exposure of a semiconductor substrate from sidewalls of a trench during the isolation of trenches, (b) the occurrence of a deformed structure in the boundary between an isolation region and an active region, and (c) the leakage of current.

To achieve the above object, the present invention provides a method for forming isolation trenches on a semiconductor substrate. The method includes the steps of depositing a pad oxide layer and a nitride layer on a semiconductor substrate, and then etching the nitride layer and the pad oxide layer. A first insulating layer is then deposited and spacers are formed along sidewalls of the pad oxide layer and the nitride layer by anisotropically etching the first insulating layer. Trenches are formed by etching the semiconductor substrate, and then a trench insulating layer pattern is formed by depositing a second insulating layer and etching the same, and polishing the trench insulating layer pattern.

According to a feature of the present invention, widths of the trench insulating layer pattern are greater than widths of opened ends of the trenches to allow for errors in the alignment of a mask.

According to another feature of the present invention, widths of the trench insulating layer pattern exceeds widths of the opened ends of the trenches by 0.1–0.3 µm.

BRIEF DESCRIPTION OF THE DRAWINGS

The accompanying drawings, which are incorporated in and constitute a part of the specification, illustrate an embodiment of the present invention, and, together with the description, serve to explain the principles of the invention.

DETAILED DESCRIPTION

This application is substantially similar to Korean Patent Application No. 97-62319 filed on Nov. 24, 1997, the disclosure of which is incorporated herein by reference in its entirety.

An embodiment of the present invention will now be described in detail with reference to the accompanying drawings.

Figure 1:
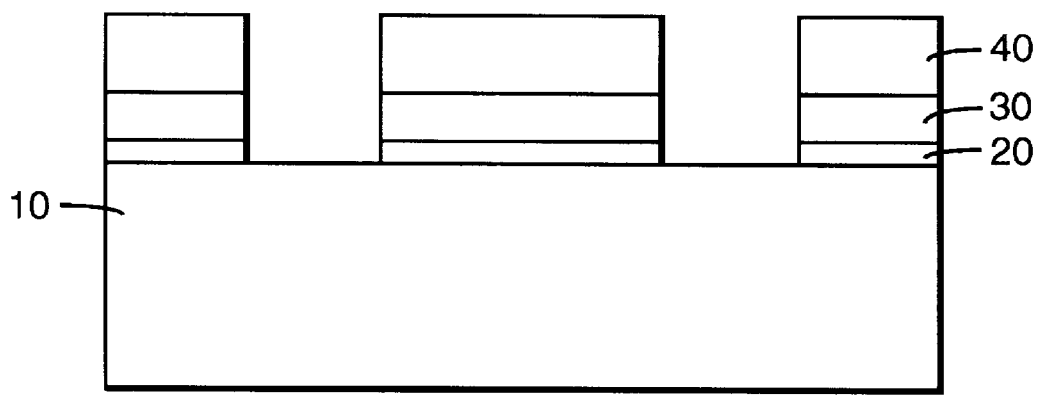
FIGS. 1–6 illustrate, in cross-section, a portion of a semiconductor device as it undergoes sequential processing steps for forming isolation trenches in accordance with the present invention.
Figure 2:
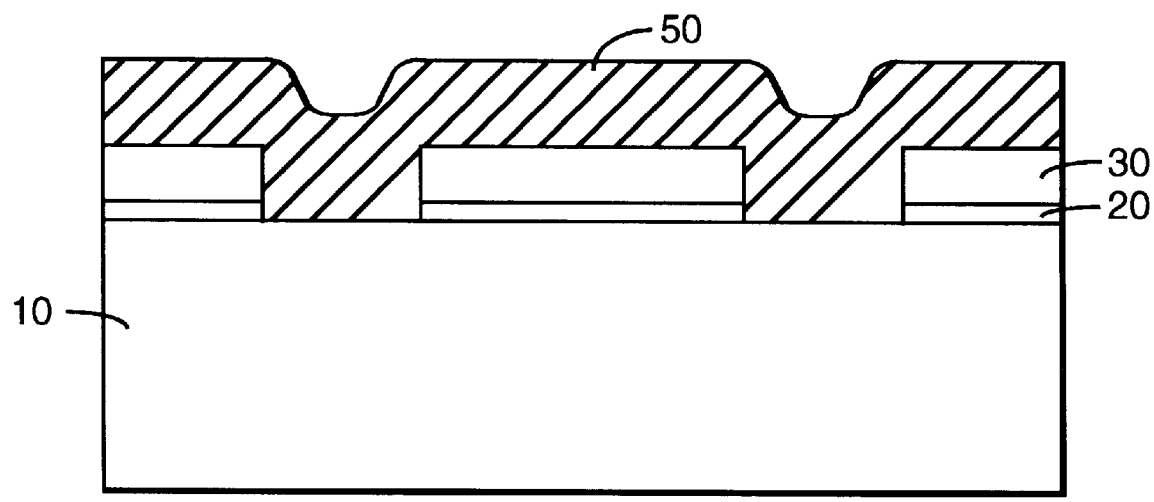

Referring to FIG. 1, deposited on a semiconductor substrate 10 are, in order, a pad oxide layer 20, a nitride layer 30, and a first photoresist 40. The pad oxide layer 20 and nitride layer 30 together can be referred to as an overlayer. Using a mask, the first photoresist 40 is exposed to develop the same. Accordingly, predetermined portions of the first photoresist 40 are removed such that portions of the nitride layer 30 are exposed. These exposed portions of the nitride layer 30 are then etched, after which the newly-exposed portions of the pad oxide layer 20 are etched. Subsequently, the rest of the first photoresist 40 is removed, then a first insulating layer 50 (also referred to as a spacer layer) is deposited as shown in FIG. 2 using either an LPCVD (low pressure chemical vapor deposition) method or an APCVD (atmospheric pressure chemical vapor deposition) method. In this embodiment, first insulating layer 50 is an oxide layer (e.g. silicon oxide) but it is understood that other electrically insulating materials such as nitride (e.g. silicon nitride) can be used to form first insulating layer 50.

Figure 3:
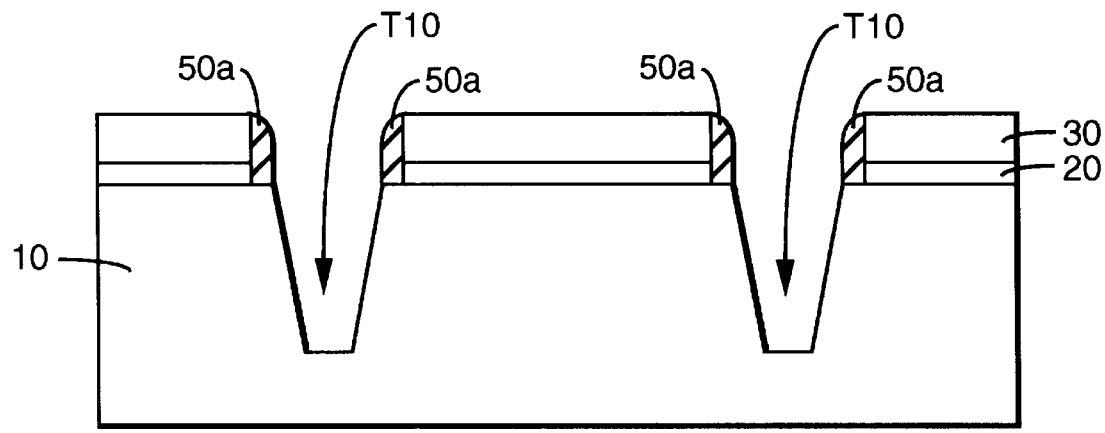

Following the above, the first insulating layer 50 is anisotropically etched. Here, as shown in FIG. 3, portions of the first insulating layer 50 are left to form spacers 50a along sidewalls of the pad oxide layer 20 and the nitride layer 30. Exposed portions of the semiconductor substrate 10 are then etched to a predetermined depth to form isolation trenches T10.

Figure 4:
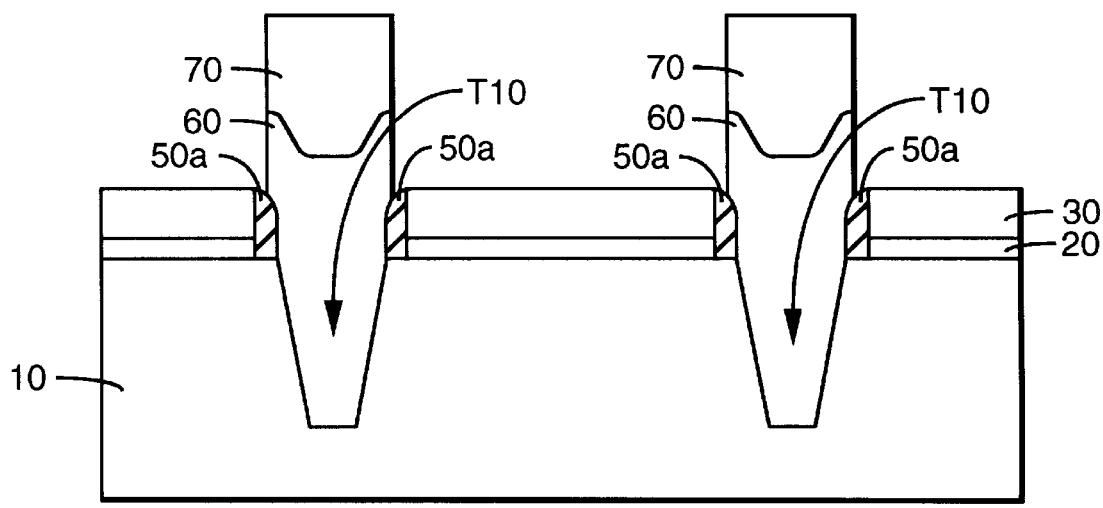

Next, a second insulating layer 60 is deposited over the entire semiconductor substrate 10 such that the trenches T10 are filled. In this embodiment, second insulating layer 60 is an oxide layer but it is understood that other electrically insulating materials such as nitride can be used to form second insulating layer 60. A second photoresist 70 is then deposited on the second insulating layer 60. The exposure of the second photoresist 70 to develop the same ensues, thereby removing portions of the second photoresist 70. Exposed portions of the second insulating layer 60 (corresponding to the removed portions of the second photoresist 70) are then etched using the remaining portions of second photoresist 70 as the mask. Accordingly, a configuration as shown in FIG. 4 results.

During the above, the second photoresist 70 is patterned and the second insulating layer 60 is etched such that their widths, i.e., critical dimensions, wherein the critical dimension is the minimum dimension obtainable using conventional photolithographic techniques, are greater than the width (i.e. the distance between spacers 50a) of an opened end of the trenches T10. This allows for errors in the alignment of the mask formed from the remaining portions of second photoresist 70. For example, the width of the remaining portions of second photoresist 70 and the second insulating layer 60 exceeds the width of the opened end of the trenches T10 by 0.1–0.3 μm. Further, the width of the remaining portions of second insulating layer 60 and the second photoresist 70 are such that they are within the boundaries formed by the nitride layer 30 (i.e. are laterally within the space between sidewalls of nitride layer 30).

Figure 5:
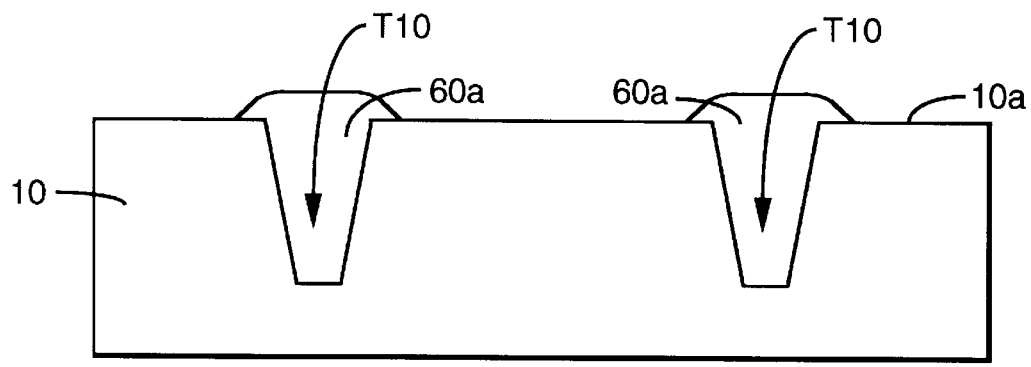

Next, the remainder of the second photoresist 70 is removed, and the remaining portions of the second insulating layer 60 is made flush to the top surface of the nitride layer 30 using a chemical mechanical polishing (CMP) process. The nitride layer 30 is then completely removed by a conventional wet etch process. The pad oxide layer 20 is then completely removed (e.g. using Hydrofluoric acid, HF). After the pad oxide layer 20 is removed, the spacers 50a combine with the remaining portions of the second insulating layer 60 to form isolation structures 60a as shown in FIG. 5.

Figure 6:
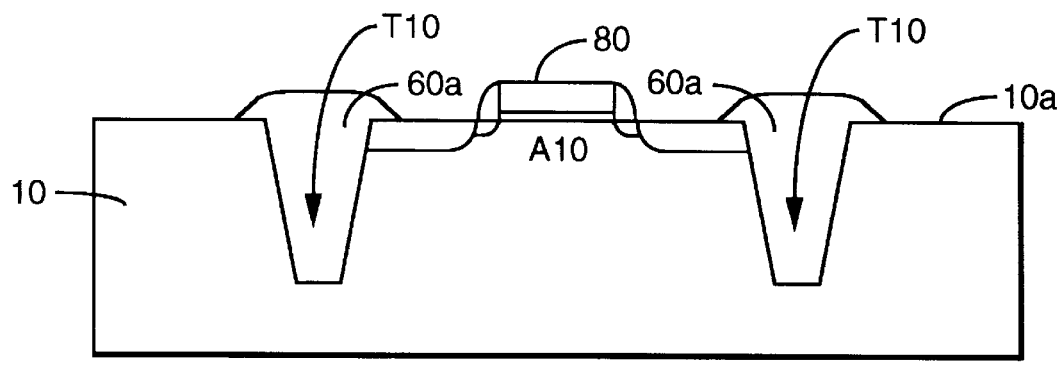

Subsequently, referring now to FIG. 6, the semiconductor substrate 10 is cleaned, and a semiconductor device such as a conventional transistor 80 is formed on an active area A10 of the semiconductor substrate 10, active areas A10 on the semiconductor substrate 10 being separated by the trenches T10.

In the above described method for forming isolation trenches on a semiconductor substrate, active areas of the semiconductor substrate are separated to provide isolation of the various electrical devices which may be disposed on the substrate. Further, referring to FIG. 6, since the isolation structures 60a have widths at substrate principal surface 10a greater than the widths of the opened ends of the trenches T10, (i.e. each isolation structure 60a extends over the peripheral edges of the corresponding trench T10), both current leakage between regions of the active areas and deformations in the boundaries of the active areas and the trenches are prevented.

While the particular process as herein shown and disclosed in detail is fully capable of obtaining the objects and advantages herein before stated, it is to be understood that it is merely illustrative and not intending to be limiting. For example, although trenches T10 in FIG. 6 are used to isolate transistor 80, it is understood that one having ordinary skill in the art will realize that the trench of the present invention and the process of making the same can be used to isolate a variety of microminiature structures, such as, for example field emitters. Accordingly, the present invention is defined by the appended claims.

What is claimed is:

1. A method for providing an insulation trench on a semiconductor substrate, comprising the steps of:

depositing a pad oxide layer and a nitride layer on a semiconductor substrate;

etching the nitride layer and the pad oxide layer and depositing a first insulating layer;

forming spacers along sidewalls of the pad oxide layer and the nitride layer by anisotropically etching the first insulating layer;

forming trenches by etching the semiconductor substrate;

forming a trench insulating layer pattern by depositing a second insulating layer and etching the same; and polishing the trench insulating layer pattern.

2. The method of claim 1 wherein widths of the trench insulating layer pattern are greater than widths of opened ends of the trenches to allow for errors in the alignment of a mask.

3. The method of claim 2 wherein the widths of the trench insulating layer pattern exceeds the widths of the opened ends of the trenches by 0.1–0.3 μm.

4. The method of claim 1 further comprising the step of removing the nitride layer and the pad oxide layer.

5. A method comprising the steps of:

providing a semiconductor substrate;

forming an overlayer over the substrate;

selectively patterning the overlayer to form an aperture in the overlayer, the aperture being defined by sidewalls of the overlayer;

forming spacers on the sidewalls, the spacers defining an exposed portion of the substrate;

etching the exposed portion of the substrate to form an isolation trench;

forming a second insulating layer over the overlayer and in the isolation trench; and, selectively patterning the second insulating layer to form a remaining portion of the second insulating layer, wherein the width of the remaining portion is greater than the distance between the spacers.

6. The method of claim 5 wherein the overlayer comprises a pad oxide layer and a nitride layer.

7. The method of claim 5 wherein the step of forming spacers on the sidewalls comprises the steps of:

depositing a first insulating layer over the overlayer and into the aperture; and anisotropically etching the first insulating layer.

8. The method of claim 5 wherein the width of the remaining portion is the critical dimension obtainable using conventional photolithographic techniques.

9. The method of claim 5 wherein the width of the remaining portion exceeds the distance between the spacers by 0.1 μm–0.3 μm.

10. The method of claim 5 wherein the remaining portion is laterally within the space between the sidewalls.

11. The method of claim 5 further comprising the step of polishing the remaining portion to be flush with the top surface of the overlayer.

12. The method of claim 11 further comprising the step of removing the overlayer.

13. The method of claim 12 wherein the spacers and remaining portion form an isolation structure.

14. The method of claim 13 wherein the isolation structure has a width at a principal surface of the substrate greater than the width of the open end of the isolation trench.

15. The method of claim 13 wherein the isolation structure extends over the peripheral edges of the isolation trench.

16. The method of claim 5 wherein the isolation trench defines an active area of the substrate.

* * * * *